United States Patent
Lin et al.

(10) Patent No.: US 10,014,408 B1
(45) Date of Patent: Jul. 3, 2018

(54) SEMICONDUCTOR DEVICES AND METHODS FOR FORMING THE SAME

(71) Applicant: Vanguard International Semiconductor Corporation, Hsinchu (TW)

(72) Inventors: Shin-Cheng Lin, Tainan (TW); Yu-Hao Ho, Keelung (TW); Wen-Hsin Lin, Jhubei (TW); Cheng-Tsung Wu, Taipei (TW); Manoj Kumar, Jharkhand (IN)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/608,514

(22) Filed: May 30, 2017

(51) Int. Cl.
*H01L 29/78* (2006.01)
*H01L 29/06* (2006.01)
*H01L 29/66* (2006.01)

(52) U.S. Cl.
CPC ...... *H01L 29/7817* (2013.01); *H01L 29/0653* (2013.01); *H01L 29/66681* (2013.01)

(58) Field of Classification Search
CPC .......... H01L 29/7817; H01L 29/66681; H01L 29/0653
See application file for complete search history.

(56) References Cited

U.S. PATENT DOCUMENTS

| | | | | | |
|---|---|---|---|---|---|
| 5,374,843 | A * | 12/1994 | Williams | ............... | H01L 23/585 257/335 |
| 5,386,136 | A * | 1/1995 | Williams | ............ | H01L 29/1079 257/104 |
| 6,211,552 | B1 * | 4/2001 | Efland | ................. | H01L 29/0847 257/336 |
| 6,242,787 | B1 * | 6/2001 | Nakayama | .......... | H01L 21/8249 257/335 |
| 6,404,009 | B1 * | 6/2002 | Mori | ................... | H01L 29/1083 257/335 |
| 6,483,149 | B1 * | 11/2002 | Mosher | ............. | H01L 29/66659 257/344 |
| 6,693,339 | B1 * | 2/2004 | Khemka | ............. | H01L 29/0615 257/295 |
| 6,882,023 | B2 * | 4/2005 | Khemka | ............. | H01L 29/0634 257/328 |
| 7,265,416 | B2 * | 9/2007 | Choi | ................... | H01L 29/1095 257/343 |
| 7,476,942 | B2 * | 1/2009 | Watanabe | ......... | H01L 29/66325 257/368 |

(Continued)

*Primary Examiner* — Earl Taylor
(74) *Attorney, Agent, or Firm* — Birch, Stewart, Kolasch & Birch, LLP (57) ABSTRACT

A semiconductor device includes a semiconductor substrate having a first conductivity type, and a first well region disposed in the semiconductor substrate, wherein the first well region has a second conductivity type opposite to the first conductivity type. The semiconductor device also includes a buried layer disposed in the semiconductor substrate and under the first well region, wherein the buried layer has the first conductivity type and is in contact with the first well region. The semiconductor device further includes a source electrode, a drain electrode and a gate structure disposed on the semiconductor substrate, wherein the gate structure is located between the source electrode and the drain electrode.

12 Claims, 5 Drawing Sheets

(56) References Cited

U.S. PATENT DOCUMENTS

| | | | |
|---|---|---|---|
| 7,575,977 B2* | 8/2009 | Levin | H01L 21/823807 257/E21.427 |
| 8,159,029 B2* | 4/2012 | Su | H01L 21/26586 257/343 |
| 8,334,568 B2* | 12/2012 | Ichijo | H01L 29/063 257/343 |
| 8,399,923 B2* | 3/2013 | Choi | H01L 29/0634 257/335 |
| 8,716,791 B1* | 5/2014 | Iravani | H01L 29/66681 257/339 |
| 9,105,712 B1* | 8/2015 | Levy | H01L 29/78 |
| 9,236,470 B2* | 1/2016 | Hebert | H01L 29/7816 |
| 9,245,997 B2* | 1/2016 | Hebert | H01L 29/7816 |
| 9,331,196 B2* | 5/2016 | Yang | H01L 29/7816 |
| 9,484,454 B2* | 11/2016 | Levy | H01L 29/0634 |
| 9,502,251 B1* | 11/2016 | McGregor | H01L 29/66681 |
| 9,741,844 B2* | 8/2017 | Kim | H01L 29/7816 |
| 9,806,174 B2* | 10/2017 | Levy | H01L 29/66681 |
| 9,837,400 B2* | 12/2017 | Mallikarjunaswamy | H01L 27/085 |
| 9,905,687 B1* | 2/2018 | Zhu | H01L 29/7816 |
| 2003/0173624 A1* | 9/2003 | Choi | H01L 29/1095 257/368 |
| 2006/0124999 A1* | 6/2006 | Pendharkar | H01L 29/0878 257/335 |
| 2007/0045767 A1* | 3/2007 | Zhu | H01L 23/3677 257/505 |
| 2008/0073746 A1* | 3/2008 | Tanaka | H01L 21/32 257/510 |
| 2010/0102386 A1* | 4/2010 | You | H01L 29/0878 257/336 |
| 2010/0102388 A1* | 4/2010 | Levin | H01L 21/82341 257/343 |
| 2012/0104492 A1* | 5/2012 | Chu | H01L 29/0634 257/335 |
| 2013/0134511 A1* | 5/2013 | Yang | H01L 21/761 257/339 |
| 2013/0137224 A1* | 5/2013 | Khan | H01L 29/0634 438/158 |
| 2014/0070315 A1* | 3/2014 | Levy | H01L 29/0634 257/343 |
| 2014/0353749 A1* | 12/2014 | Hebert | H01L 29/7816 257/337 |
| 2015/0279969 A1* | 10/2015 | Levy | H01L 29/0634 438/286 |
| 2015/0380398 A1* | 12/2015 | Mallikarjunaswamy | H01L 29/7823 257/272 |
| 2016/0172452 A1* | 6/2016 | Darwish | H01L 29/408 257/339 |

* cited by examiner

SEMICONDUCTOR DEVICES AND METHODS FOR FORMING THE SAME

BACKGROUND OF THE INVENTION

Field of the Invention

The invention relates to semiconductor devices, and in particular to semiconductor devices having a buried layer and methods for forming the same.

Description of the Related Art

In the semiconductor industry, well regions and top layers with two opposite conductivity types are disposed in the drift region of the ultra-high-voltage (UHV) elements, for example, a deep high-voltage n-well (DHVNW) and a p-type top layer in the deep high-voltage n-well are close to the top surface of the device, so that carriers with two opposite conductivity types can be produced to maintain the charge balance, and the ultra-high-voltage elements can be fully depleted (FD) more easily. Accordingly, the breakdown voltages of the elements can be increased, and the turn-on resistances of the elements can be decreased.

However, in a non-epitaxiel semiconductor process, the deep high-voltage wells are formed by thermal diffusion and drive in (D/I), which will cause the carrier concentration to be distributed unevenly. In particular, the high-concentration carriers will be concentrated at the top surface of the semiconductor substrate. To evenly distribute the concentration of the carriers, the carrier concentration of the top layer in the deep high-voltage well should be increased so that a fully depleted state can easily be achieved, but at the same time, the turn-on resistance of the ultra-high-voltage elements will be increased. In addition, since the carriers of the deep high-voltage well are concentrated in the top portion, the carriers may easily be driven into the field oxide layer because of the high electric field. Thus, the reliability of the elements may be affected.

Although existing semiconductor devices and methods for forming the same have been adequate for their intended purposes, they have not been entirely satisfactory in all respects. Therefore, up to the present, there are still some problems that can be improved in adjusting the carrier concentration of the drift region in the semiconductor device and technology.

BRIEF SUMMARY OF THE INVENTION

Embodiments of semiconductor devices and methods for forming the same are provided. To decrease the surface field of the semiconductor devices so that the fully depleted state of the semiconductor devices can be easily achieved, some embodiments of the disclosure provide a semiconductor substrate having a first conductivity type, and a first well region is disposed in the semiconductor substrate, that is, a deep high-voltage well. The first well region has a second conductivity type opposite to the first conductivity type. By disposing a buried layer having the first conductivity type under the first well region, the carrier concentration of the first top layer having the first conductivity type and located in the first well region can be decreased, and the carrier concentration having the first conductivity type and originally located in the top portion of the semiconductor substrate can be distributed to the bottom of the semiconductor substrate, such that the carrier concentration of the first well region close to the top surface of the semiconductor substrate will not be balanced by merely one of the first top layer having the opposite conductivity type, and the turn-on resistance of the semiconductor device can be decreased.

In addition, by disposing a buried layer with opposite conductivity type in the deep high-voltage well, the carrier concentration of the deep high-voltage well will not be concentrated in the top portion. Therefore, the probability of the carriers being driven into the field oxide layer may be decreased effectively, and the reliability of the semiconductor devices can be enhanced.

Some embodiments of the disclosure provide a semiconductor device. The semiconductor device includes a semiconductor substrate having a first conductivity type, and a first well region disposed in the semiconductor substrate, wherein the first well region has a second conductivity type opposite to the first conductivity type. The semiconductor device also includes a buried layer disposed in the semiconductor substrate and under the first well region, wherein the buried layer has the first conductivity type and the buried layer is in contact with the first well region. The semiconductor device further includes a source electrode, a drain electrode and a gate structure disposed on the semiconductor substrate, wherein the gate structure is located between the source electrode and the drain electrode.

Some embodiments of the disclosure provide a method for forming a semiconductor device. The method includes providing a semiconductor substrate having a first conductivity type, forming a first well region in the semiconductor substrate, wherein the first well region has a second conductivity type opposite to the first conductivity type. The method also includes forming a buried layer in the semiconductor substrate and under the first well region, wherein the buried layer has the first conductivity type and the buried layer is in contact with the first well region. The method further includes forming a source electrode, a drain electrode and a gate structure on the semiconductor substrate, wherein the gate structure is located between the source electrode and the drain electrode.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that, in accordance with the standard practice in the industry, various features are not drawn to scale. In fact, the dimensions of the various features may be arbitrarily increased or reduced for clarity of discussion.

FIGS. 1 to 7B are cross-sectional views illustrating an exemplary sequential forming process of a semiconductor device in accordance with some embodiments.

DETAILED DESCRIPTION OF THE INVENTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some embodiments are described below. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a semiconductor device are provided. FIGS. 1 to 7 are cross-sectional views illustrating an exemplary sequential forming process of a semiconductor device 100 in accordance with some embodiments.

Figure 1:
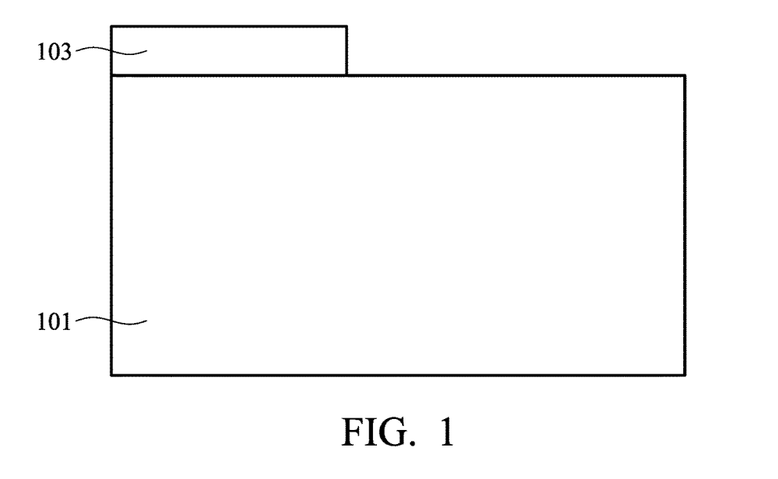

As shown in FIG. 1, a semiconductor substrate 101 having a first conductivity type is provided, in accordance with some embodiments. The semiconductor substrate 101 may be made of silicon or another semiconductor material. Alternatively, the semiconductor substrate 101 may include other elementary semiconductor materials such as germanium. In some embodiments, the semiconductor substrate 101 is made of a compound semiconductor such as silicon carbide, gallium nitride, gallium arsenic, indium arsenide, or indium phosphide. In some embodiments, the semiconductor substrate 101 is made of an alloy semiconductor such as silicon germanium, silicon germanium carbide, gallium arsenic phosphide, or gallium indium phosphide. The first conductivity type is p-type in the present embodiment. Therefore, the semiconductor substrate 101 is a lightly-doped p-type substrate. In other embodiments, the first conductivity type is n-type. Therefore, the semiconductor substrate 101 is a lightly-doped n-type substrate.

Next, as shown in FIG. 1, a patterned photoresist layer 103 is optionally formed on the semiconductor substrate 101. The region not covered by the patterned photoresist layer 103 is the region in which a buried layer and a first well region are formed subsequently, and the region covered by the patterned photoresist layer 103 is the region in which a second well region is formed subsequently. In other embodiments, the formation of the patterned photoresist layer 103 can be omitted, and a buried layer can be formed comprehensively in the semiconductor substrate 101 in the subsequent processes.

Figure 2:
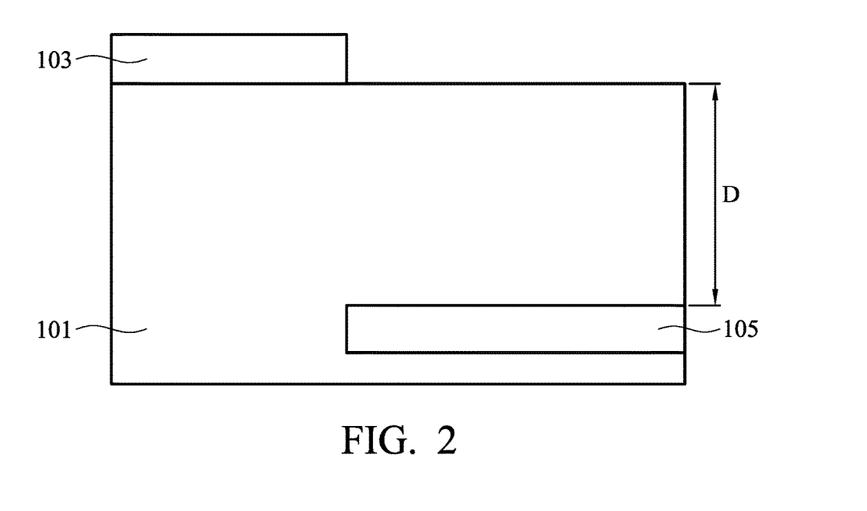

As shown in FIG. 2, in accordance with some embodiments, the patterned photoresist layer 103 is utilized as a mask, and a buried layer 105 having the first conductivity type is formed in the semiconductor substrate 101 by ion implantation process and thermal diffusion process. In the present embodiment, the semiconductor substrate 101 is a p-type substrate, and the buried layer 105 is formed by implanting p-type dopants, such as boron (B), in the semiconductor substrate 101. In other embodiments, the semiconductor substrate 101 is an n-type substrate, and the buried layer 105 is formed by implanting n-type dopants, such as phosphorous (P) or arsenic (As), in the semiconductor substrate 101. In addition, in some embodiments, the buried layer 105 has a dopant concentration in a range from about $1\times10^{14}$ atoms/cm$^3$ to about $1\times10^{15}$ atoms/cm$^3$, and a depth of the buried layer 105 is in a range from about 5 μm to about 15 μm.

Figure 3:
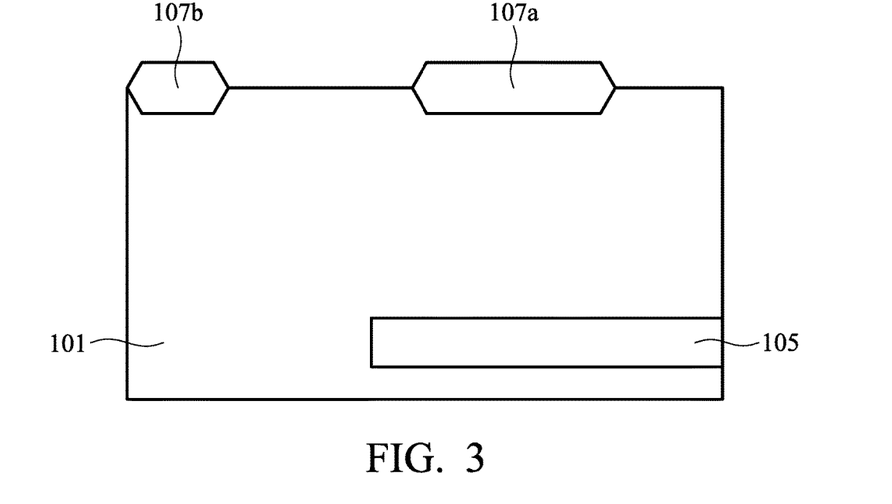

Then, as shown in FIG. 3, the patterned photoresist layer 103 is removed, and isolation structures 107a and 107b are formed on the semiconductor substrate 101. In some embodiments, a portion of the isolation structures 107a and 107b are embedded in the semiconductor substrate 101, and the other portion of the isolation structures 107a and 107b are formed on the semiconductor substrate 101.

In some embodiments, the isolation structures 107a and 107b may be formed by local oxidation of silicon (LOCOS) technology. In other embodiments, the isolation structures 107a and 107b may be shallow trench isolation (STI) structures. In some embodiments, the isolation structures 107a and 107b are made of silicon oxide, silicon nitride, silicon oxynitride or another applicable dielectric material.

Figure 4:
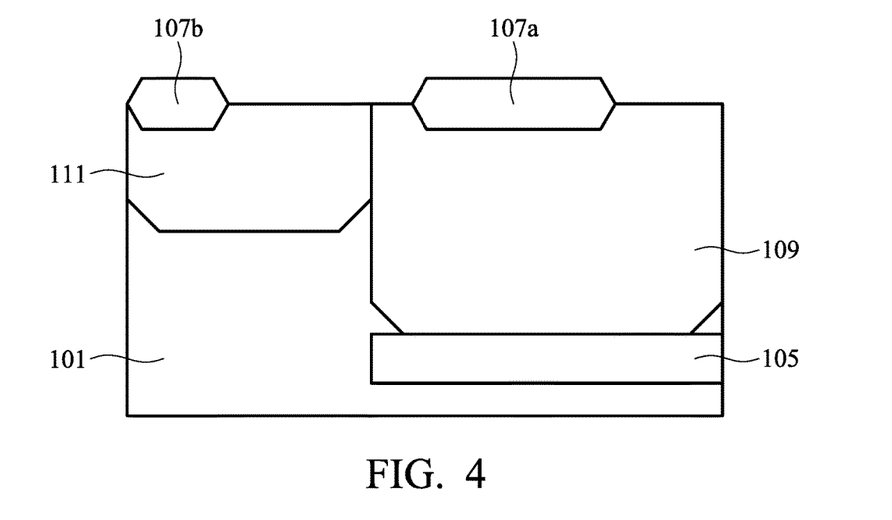

As shown in FIG. 4, in accordance with some embodiments, a first well region 109 is formed in the semiconductor substrate 101 and on the buried layer 105, and the first well region 109 has a second conductivity type opposite to the first conductivity type. In the present embodiment, the first well region 109 is a deep high-voltage n-well, and the first well region 109 has a dopant concentration in a range from about $1\times10^{15}$ atoms/cm$^3$ to about $5\times10^{15}$ atoms/cm$^3$. It is important to note that the first well region 109 is in contact with the buried layer 105. Since the first well region 109 and the buried layer 105 have different conductivity types, a p-n junction is formed at the interface of the first well region 109 and the buried layer 105.

The first well region 109 may be formed by ion implantation. In the present embodiment, the first well region 109 and the buried layer 105 are formed by two ion implantation processes respectively. In other embodiments, the first well region 109 and the buried layer 105 may be formed simultaneously by ion implantation processes with the same implantation energy. For example, the buried layer 105 may be formed by implanting boron (B) ions, and the first well region 109 may be formed by implanting phosphorous (P) or arsenic (As) ions. Since the boron ions are smaller, when the implantation energies are the same, boron ions can be implanted into the semiconductor substrate 101 at faster speeds. Therefore, the p-type buried layer 105 can be formed under the n-type first well region 109.

Then, as shown in FIG. 4, a second well region 111 is formed in the semiconductor substrate 101 having the first conductivity type, the second well region 111 has the first conductivity type and is disposed adjacent to the first well region 109. The first well region 109 has a depth greater than that of the second well region 111. Therefore, the first well region 109 may be referred as a deep high-voltage well. Next, in the present embodiment, the second well region 111 is a p-type well region, and the second well region 111 has a dopant concentration in a range from about $1\times10^{16}$ atoms/cm$^3$ to about $9\times10^{16}$ atoms/cm$^3$. In some embodiments, the isolation structure 107a is located on the first well region 109 and covering a portion of the first well region 109. The isolation structure 107b is located on the second well region 111 and covering a portion of the second well region 111. In the present embodiment, the buried layer 105 has a length at least about the same as a length of the first well region 109. In other embodiments which the patterned photo resist layer 103 is not formed, the buried layer 105 is extended under the second well region 111.

Figure 5:
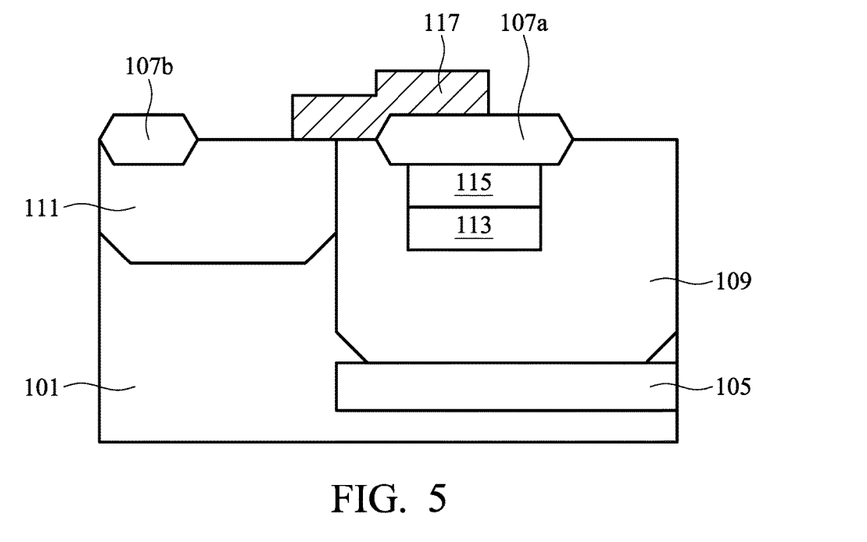

As shown in FIG. 5, in accordance with some embodiments, a first top layer 113 and a second top layer 115 are formed in the first well region 109 close to the top portion of the first well region 109. The first top layer 113 has the first conductivity type. The second top layer 115 is located on and in contact with the first top layer 113. The second top layer 115 has the second conductivity type. In the present embodiment, the first top layer 113 is p-type. The second top layer 115 is n-type, and the first top layer 113 and the second top layer 115 are entirely disposed under the isolation structure 107a, which means projections of the first top layer 113 and the second top layer 115 on the semiconductor substrate 101 are entirely covered by a projection of the isolation structure 107a on the semiconductor substrate 101.

It is important to note that since the first top layer 113 and the first well region 109 have opposite conductivity types, a p-n junction is formed at the interface of the first top layer 113 and the first well region 109. Similarly, since the second top layer 115 and the first top layer 113 have opposite conductivity types, another p-n junction is formed at the interface of the second top layer 115 and the first top layer 113. In some embodiments, both the first top layer 113 and the second top layer 115 have dopant concentrations in a range from about $1\times10^{16}$ atoms/cm$^3$ to about $9\times10^{16}$ atoms/cm$^3$, and the dopant concentrations of the first top layer 113 and the second top layer 115 are almost the same.

Generally, the first top layer 113 and the second top layer 115 have dopant concentrations which are greater than the dopant concentration of the first well region 109, and the dopant concentration of the first well region 109 is greater than that of the buried layer 105.

Moreover, according to some embodiments of the present disclosure, p-n junctions are formed at the interface between the buried layer 105 and the first well region 109, the interface between the first well region 109 and the first top layer 113, and the interface of the first top layer 113 and the second top layer 115. By disposing several p-n junctions which are evenly distributed in the semiconductor substrate 101, the surface field can be reduced multiply (reduced surface field, RESURF), such that the semiconductor devices can endure higher voltage, and the fully depleted state can be easily achieved. As a result, the turn-on resistance can be decreased, and the breakdown voltage can be increased.

Next, as shown in FIG. 5, a gate structure 117 is formed on the semiconductor substrate 101 and on a portion of the isolation structure 107a, and a portion of the first well region 109 and a portion of the second well region 111 are covered by the gate structure 117. In some embodiments, the gate structure 117 may include a single layer or multiple layers of gate dielectric layers (not shown) and a single layer or multiple layers of gate electrode layers (not shown) disposed on the gate dielectric layers.

The gate dielectric layers may be made of silicon oxide, silicon nitride, silicon oxynitride, dielectric materials with high dielectric constant (high-k), or a combination thereof. In some embodiments, the gate dielectric layers are deposited by a plasma enhanced chemical vapor deposition (PECVD) process or a spin coating process.

The gate electrode layers are made of conductive materials, such as aluminum (Al), copper (Cu), tungsten (W), titanium (Ti), tantalum (Ta), polysilicon, or other applicable materials. In some embodiments, the gate electrode layers are formed by a deposition process and a patterning process. The deposition process may be a chemical vapor deposition (CVD) process, a physical vapor deposition (PVD) process, an atomic layer deposition (ALD) process, a high density plasma chemical vapor deposition (HDPCVD) process, a metal organic chemical vapor deposition (MOCVD) process, a plasma enhanced chemical vapor deposition (PECVD) process, or a combination thereof.

Figure 6:
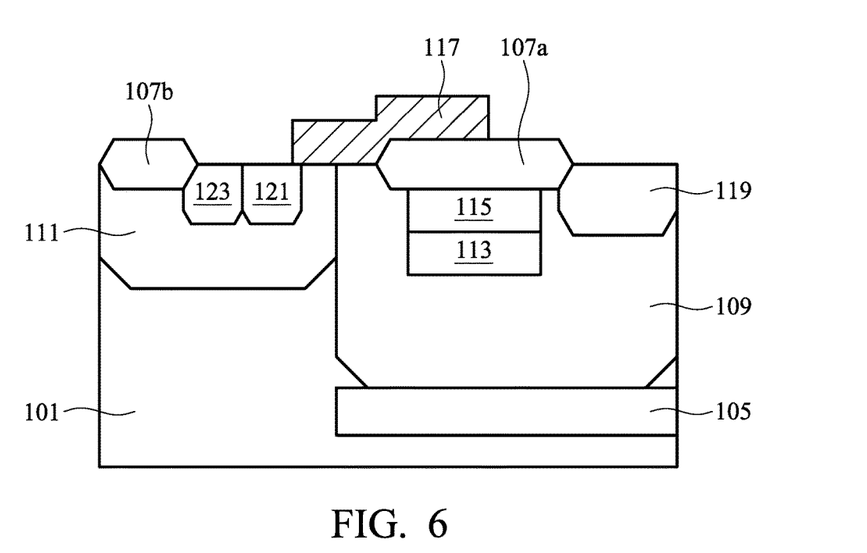

As shown in FIG. 6, in accordance with some embodiments, a first doped region 119 is formed in the first well region 109, a second doped region 121 and a third doped region 123 are formed in the second well region 111. In addition, the third doped region 123 is adjacent to the second doped region 121. In some embodiments, the conductivity types of the first doped region 119 and the first well region 109 are the same, the conductivity type of the second doped region 121 is opposite to the conductivity type of the second well region 111, and the conductivity types of the third doped region 123 and the second well region 111 are the same. In the present embodiment, the first doped region 119 is n-type, the second doped region 121 is n-type, the third doped region 123 is p-type, and the first doped region 119, the second doped region 121 and the third doped region 123 have dopant concentrations in a range from about $1\times10^{18}$ atoms/cm$^3$ to about $1\times10^{19}$ atoms/cm$^3$.

Figure 7A:
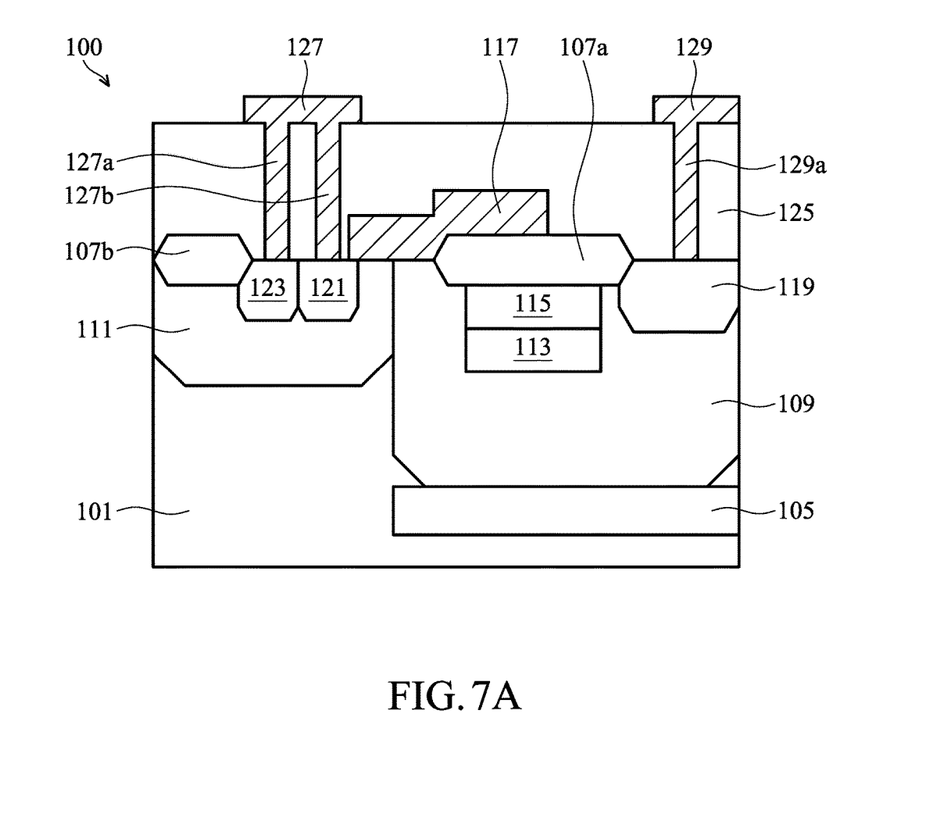

As shown in FIG. 7A, an inter-layer dielectric (ILD) layer 125 is formed on the semiconductor substrate 101, the isolation structures 107a and 107b and the gate structure 117, in accordance with some embodiments. In some embodiments, the inter-layer dielectric layer 125 is made of silicon oxide, silicon nitride, phosphosilicate glass (PSG), borophosphosilicate glass (BPSG), and/or other applicable dielectric materials. The inter-layer dielectric layer 125 may be formed by a chemical vapor deposition (CVD) process, a physical vapor deposition (PVD) process, an atomic layer deposition (ALD) process, a spin-on coating process, or another applicable process.

Figure 7B:
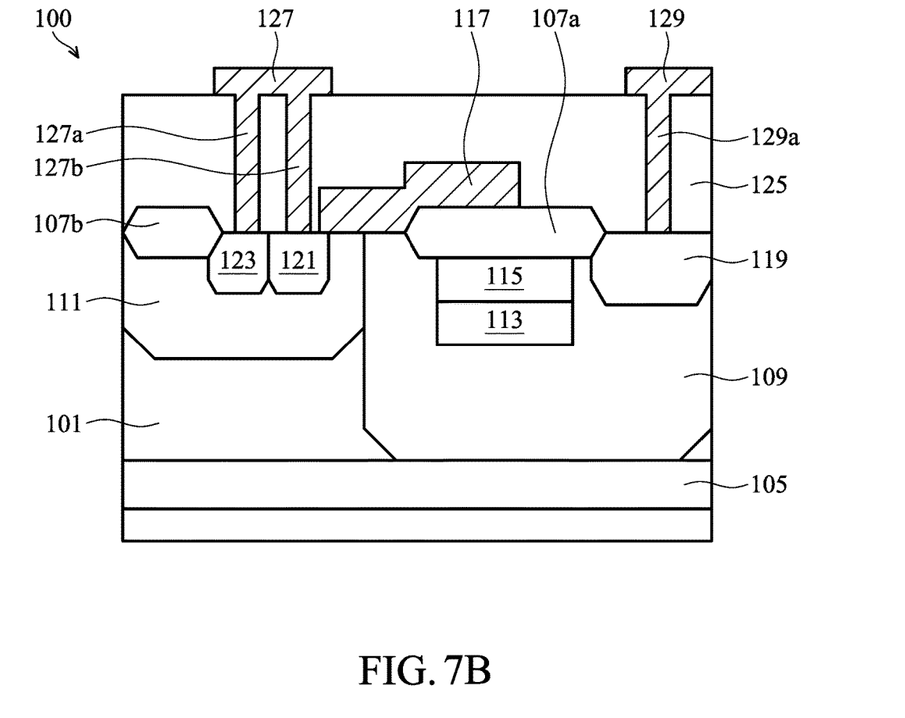

After the inter-layer dielectric layer 125 is formed, a source electrode 127 and a drain electrode 129 are formed on the inter-layer dielectric layer 125, as shown in FIG. 7A in accordance with some embodiments. Moreover, the vias 127a, 127b and 129a are formed in the inter-layer dielectric layer 125. The drain electrode 129 is electrically connected to the first doped region 119 through the via 129a, and the source electrode 127 is electrically connected to the third doped region 123 and the second doped region 121 through the vias 127a and 127b respectively. In some embodiments, the source electrode 127, the drain electrode 129 and the vias 127a, 127b and 129a may comprise metal or another applicable electrically conductive material. In other embodiments which the patterned photo resist layer 103 is not formed, the buried layer 105 is extended under the second well region 111, as shown in FIG. 7B.

In some embodiments, the gate structure 117 is disposed between the source electrode 127 and the drain electrode 129, and the gate structure 117 is closer to the source electrode 127 than the drain electrode 129. Once the source electrode 127 and the drain electrode 129 are formed, the semiconductor device 100 is completed.

To decrease the surface field of the semiconductor devices so that the fully depleted state of the semiconductor devices can be easily achieved, some embodiments of the disclosure provide a semiconductor substrate having a first conductivity type, and a first well region is disposed in the semiconductor substrate, that is, a deep high-voltage well. The first well region has a second conductivity type opposite to the first conductivity type. By disposing a buried layer having the first conductivity type under the first well region, the carrier concentration of the first top layer having the first conductivity type and located in the first well region can be decreased, and the carrier concentration having the first conductivity type and originally located in the top portion of the semiconductor substrate can be distributed to the bottom of the semiconductor substrate, such that the carrier concentration of the first well region close to the top surface of the semiconductor substrate will not be balanced by merely one of the first top layer having the opposite conductivity type, and the turn-on resistance of the semiconductor device can be decreased.

In addition, by disposing a buried layer with opposite conductivity type in the deep high-voltage well, the carrier concentration of the deep high-voltage well will not be concentrated in the top portion. Therefore, the probability of the carriers being driven into the field oxide layer may be decreased effectively, and the reliability of the semiconductor devices can be enhanced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate having a first conductivity type;
   a first well region disposed in the semiconductor substrate, wherein the first well region has a second conductivity type opposite to the first conductivity type;
   a first top layer disposed in the first well region and having the first conductivity type;
   a second top layer disposed in the first well region and on the first top layer, having the second conductivity type, wherein the second top layer is in contact with the first top layer;
   a buried layer disposed in the semiconductor substrate and under the first well region, wherein the buried layer has the first conductivity type and is in contact with the first well region; and
   a source electrode, a drain electrode and a gate structure disposed on the semiconductor substrate, wherein the gate structure is located between the source electrode and the drain electrode;
   wherein the first top layer and the second top layer have dopant concentrations which are greater than a dopant concentration of the first well region, and the dopant concentration of the first well region is greater than that of the buried layer.

2. The semiconductor device as claimed in claim 1, wherein the gate structure is closer to the source electrode than the drain electrode.

3. The semiconductor device as claimed in claim 1, further comprising:
   a second well region disposed in the semiconductor substrate and being adjacent to the first well region, wherein the second well region has the first conductivity type; and
   an isolation structure covering a portion of the first well region,
   wherein the gate structure is disposed on a portion of the isolation structure and covers a portion of the first well region and a portion of the second well region.

4. The semiconductor device as claimed in claim 3, further comprising:
   a first doped region disposed in the first well region, having the second conductivity type;
   a second doped region disposed in the second well region, having the second conductivity type; and
   a third doped region disposed in the second well region, having the first conductivity type and being adjacent to the second doped region,
   wherein the first doped region is electrically connected to the drain electrode, and the second doped region and the third doped region are electrically connected to the source electrode.

5. The semiconductor device as claimed in claim 3, wherein the buried layer is extended under the second well region.

6. The semiconductor device as claimed in claim 1, wherein the first top layer and the second top layer are entirely disposed under the isolation structure.

7. A method for forming a semiconductor device, comprising:
   providing a semiconductor substrate having a first conductivity type;
   forming a first well region in the semiconductor substrate, wherein the first well region has a second conductivity type opposite to the first conductivity type;
   forming a first top layer in the first well region, wherein the first top layer has the first conductivity type;
   forming a second top layer in the first well region and on the first top layer, wherein the second top layer has the second conductivity type, and the second top layer is in contact with the first top layer;
   forming a buried layer in the semiconductor substrate and under the first well region, wherein the buried layer has the first conductivity type and is in contact with the first well region; and
   forming a source electrode, a drain electrode and a gate structure on the semiconductor substrate, wherein the gate structure is located between the source electrode and the drain electrode;
   wherein the first top layer and the second top layer have dopant concentrations which are greater than a dopant concentration of the first well region, and the dopant concentration of the first well region is greater than that of the buried layer.

8. The method as claimed in claim 7, wherein the gate structure is closer to the source electrode than the drain electrode.

9. The method as claimed in claim 7, further comprising:
   forming a second well region in the semiconductor substrate, wherein the second well region is adjacent to the first well region, and the second well region has the first conductivity type; and
   forming an isolation structure covering a portion of the first well region,
   wherein the gate structure is formed on a portion of the isolation structure and covers a portion of the first well region and a portion of the second well region.

10. The method as claimed in claim 9, further comprising:
    forming a first doped region in the first well region, wherein the first doped region has the second conductivity type;
    forming a second doped region in the second well region, wherein the second doped region has the second conductivity type; and
    forming a third doped region in the second well region, wherein the third doped region has the first conductivity type, and the third doped region is adjacent to the second doped region,
    wherein the first doped region is electrically connected to the drain electrode, and the second doped region and the third doped region are electrically connected to the source electrode.

11. The method as claimed in claim 9, wherein the buried layer is extended under the second well region.

12. The method as claimed in claim 7, wherein the first top layer and the second top layer are entirely formed under the isolation structure.

\* \* \* \* \*